(12) United States Patent
Luo

(10) Patent No.: US 9,298,084 B2
(45) Date of Patent: Mar. 29, 2016

(54) PREVENTING DOUBLE PATTERNING ODD CYCLES

(71) Applicant: Synopsys Inc., Mountain View, CA (US)

(72) Inventor: Jianfeng Luo, Foster City, CA (US)

(73) Assignee: Synopsys Inc., Mountain View, CA (US)

( * ) Notice: Subject to any disclaimer, the term of this patent is extended or adjusted under 35 U.S.C. 154(b) by 0 days.

(21) Appl. No.: 14/328,386

(22) Filed: Jul. 10, 2014

(65) Prior Publication Data

US 2015/0026651 A1 Jan. 22, 2015

Related U.S. Application Data

(60) Provisional application No. 61/856,205, filed on Jul. 19, 2013.

(51) Int. Cl.
*G06F 17/50* (2006.01)
*G03F 1/70* (2012.01)

(52) U.S. Cl.
CPC .......................... *G03F 1/70* (2013.01)

(58) Field of Classification Search
CPC ............ G06F 17/5081; G06F 17/5077; G06F 17/5068; G06F 2217/12; G03F 1/70; G03F 7/70466
USPC .................... 716/50–56; 430/5, 30
See application file for complete search history.

(56) References Cited

U.S. PATENT DOCUMENTS 8,448,100 B1 * 5/2013 Lin et al. .................... 716/54
2012/0216157 A1 * 8/2012 Luo et al. .................... 716/55

OTHER PUBLICATIONS

DRC debugging issues in AMS/custom designs at 20nm, EE times, May 23, 2013.*

* cited by examiner

*Primary Examiner* — Nha Nguyen
(74) *Attorney, Agent, or Firm* — Paul S. Drake; Craig Shinners

(57) ABSTRACT

A method, system or computer usable program product for preventing odd cycles caused by design modifications to a double patterning layout including utilizing a processor to identify a set of double patterning cycles in the layout for storage in a memory; receiving a set of design modifications to the layout; utilizing the processor to identify from the set of double patterning cycles a subset of double patterning cycles affected by the set of design modifications; utilizing the processor to identify from the set of design modifications a subset of design modifications which may cause odd cycles in the subset of double patterning cycles; and providing a notification of the subset of design modifications.

29 Claims, 8 Drawing Sheets

PREVENTING DOUBLE PATTERNING ODD CYCLES

PRIORITY CLAIM

This application claims priority to U.S. Provisional Application No. 61/856,205 entitled "Preventing Double Patterning Odd Cycles" filed Jul. 19, 2013.

BACKGROUND

1. Technical Field

The present invention relates generally to preventing double patterning odd cycles, and in particular, to a computer implemented method for preventing odd cycle occurrences in double patterning layouts.

2. Description of Related Art

As semiconductor processing has improved faster than photolithography light source and photoresist technology, a technique called double patterning has emerged as a mainstream semiconductor process. Double patterning allows one to generate semiconductor structures through photolithography than are smaller and closer together than the wavelength of the photolithography light source. As a result, structures such as small as 20 nm or even smaller may be generated using a 193 nm light source using double patterning techniques. There are several techniques for double patterning including dual tone photoresist or development, double exposure, double exposure/double etch, etc.

Many adjoining structures may be generated utilizing double patterning. An issue called odd cycles can arise with double patterning. That is, if an odd number of structures are adjoining in a closed loop pattern, then double patterning cannot be successfully implemented. For example, if there are 5 tightly grouped adjoining structures arranged in a closed loop, then double patterning may not be utilized. If those 5 tightly grouped adjoining structures are in a sequence A, B, C, D and E with E also adjoining A, then a 5 sided closed loop is generated. However, with double patterning, no two adjoining structures may be generated in the same mask or mask sequence due to their close proximity (e.g., 20 nm). That is, A and C may be generated using one mask, but not E because it is adjoining A. In addition, B and D can be generated in the second mask, but not E because it is adjoining D. As a result, no odd number of tightly grouped structures in a closed loop can be double patterned, only an even number.

SUMMARY

The illustrative embodiments provide a method, system, and computer usable program product for preventing odd cycles caused by design modifications to a double patterning layout including utilizing a processor to identify a set of double patterning cycles in the layout for storage in a memory; receiving a set of design modifications to the layout; utilizing the processor to identify from the set of double patterning cycles a subset of double patterning cycles affected by the set of design modifications; utilizing the processor to identify from the set of design modifications a subset of design modifications which may cause odd cycles in the subset of double patterning cycles; and providing a notification of the subset of design modifications.

BRIEF DESCRIPTION OF THE SEVERAL VIEWS OF THE DRAWINGS

The novel features believed characteristic of the invention are set forth in the appended claims. The invention itself, further objectives and advantages thereof, as well as a preferred mode of use, will best be understood by reference to the following detailed description of illustrative embodiments when read in conjunction with the accompanying drawings, wherein:

DETAILED DESCRIPTION

Processes and devices may be implemented and utilized for preventing double patterning odd cycles. These processes and apparatuses may be implemented and utilized as will be explained with reference to the various embodiments below.

Figure 1:
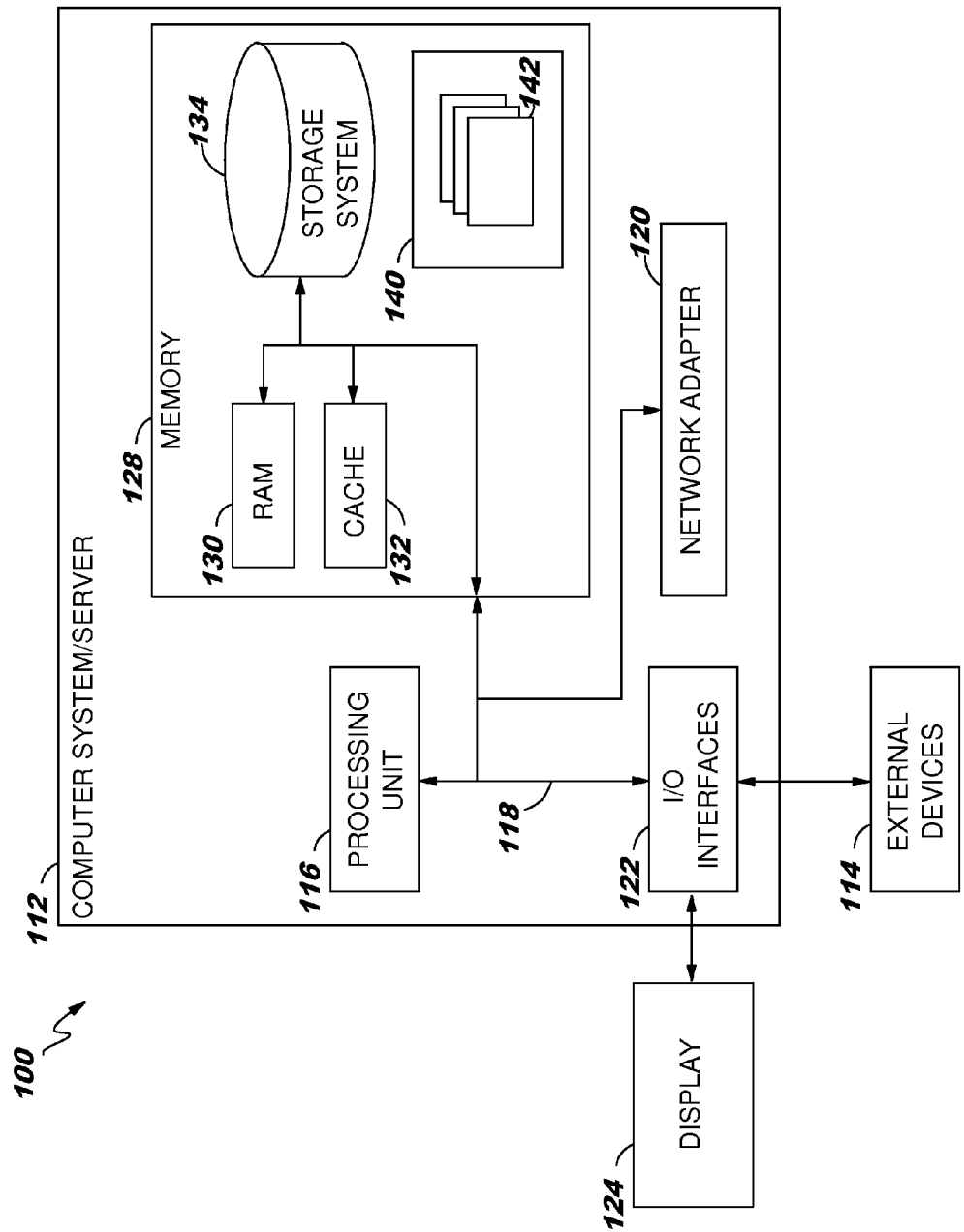
FIG. 1 is a block diagram of an illustrative data processing system in which various embodiments of the present disclosure may be implemented.

FIG. 1 is a block diagram of an illustrative data processing system in which various embodiments of the present disclosure may be implemented. Data processing system 100 is one example of a suitable data processing system and is not intended to suggest any limitation as to the scope of use or functionality of the embodiments described herein. Regardless, data processing system 100 is capable of being implemented and/or performing any of the functionality set forth herein such as preventing double patterning odd cycles.

In data processing system 100 there is a computer system/server 112, which is operational with numerous other general purpose or special purpose computing system environments, peripherals, or configurations. Examples of well-known computing systems, environments, and/or configurations that may be suitable for use with computer system/server 112 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 112 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 112 may be practiced in distributed computing environments where tasks are performed by remote processing devices that are linked through a communications network. In a distributed computing environment, program modules may be located in both local and remote computer system storage media including memory storage devices.

As shown in FIG. 1, computer system/server 112 in data processing system 100 is shown in the form of a general-purpose computing device. The components of computer system/server 112 may include, but are not limited to, one or more processors or processing units 116, a system memory 128, and a bus 118 that couples various system components including system memory 128 to processor 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 112 typically includes a variety of computer system readable media. Such media may be any available media that is accessible by computer system/server 112, and it includes both volatile and non-volatile media, removable and non-removable media.

System memory 128 can include non-transitory computer system readable media in the form of volatile memory, such as random access memory (RAM) 130 and/or cache memory 132. Computer system/server 112 may further include other removable/non-removable, volatile/non-volatile non-transitory computer system storage media. By way of example, storage system 134 can be provided for reading from and writing to a non-removable, non-volatile magnetic media (not shown and typically called a "hard drive"). Although not shown, a USB interface for reading from and writing to a removable, non-volatile magnetic chip (e.g., a "flash drive"), and an optical disk drive for reading from or writing to a removable, non-volatile optical disk such as a CD-ROM, DVD-ROM or other optical media can be provided. In such instances, each can be connected to bus 118 by one or more data media interfaces. Memory 128 may include at least one program product having a set (e.g., at least one) of program modules that are configured to carry out the functions of the embodiments. Memory 128 may also include data that will be processed by a program product.

Program/utility 140, having a set (at least one) of program modules 142, may be stored in memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of the embodiments. For example, a program module may be software for preventing double patterning odd cycles.

Computer system/server 112 may also communicate with one or more external devices 114 such as a keyboard, a pointing device, a display 124, etc.; one or more devices that enable a user to interact with computer system/server 112; and/or any devices (e.g., network card, modem, etc.) that enable computer system/server 112 to communicate with one or more other computing devices. Such communication can occur via I/O interfaces 122 through wired connections or wireless connections. Still yet, computer system/server 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118. It should be understood that although not shown, other hardware and/or software components could be used in conjunction with computer system/server 112. Examples, include, but are not limited to: microcode, device drivers, tape drives, RAID systems, redundant processing units, data archival storage systems, external disk drive arrays, etc.

Figure 2:
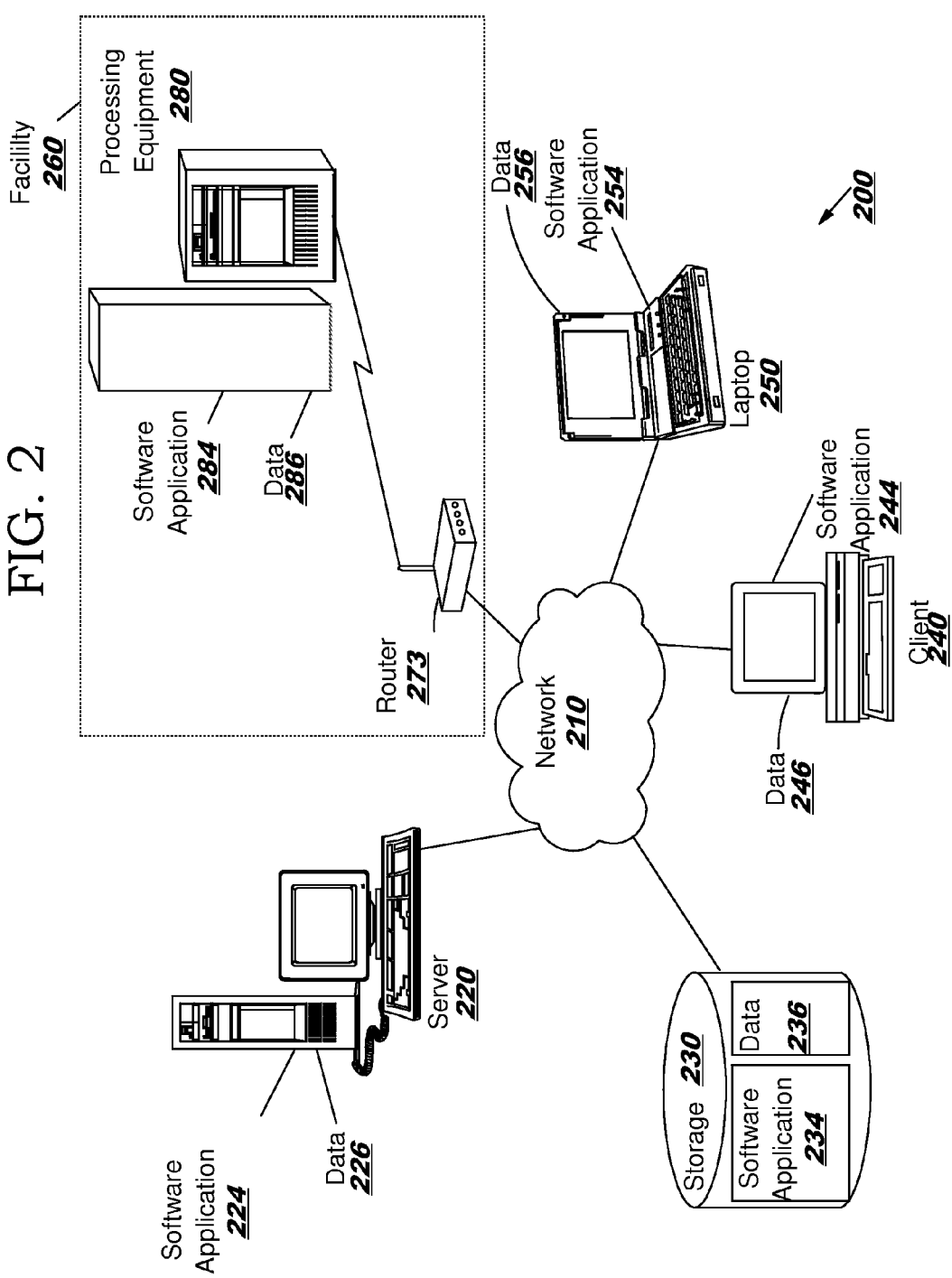
FIG. 2 is a block diagram of an illustrative network of data processing systems in which various embodiments of the present disclosure may be implemented.

FIG. 2 is a block diagram of an illustrative network of data processing systems in which various embodiments of the present disclosure may be implemented. Data processing environment 200 is a network of data processing systems such as described above with reference to FIG. 1. Software applications such as for preventing double patterning odd cycles may execute on any computer or other type of data processing system in data processing environment 200. Data processing environment 200 includes network 210. Network 210 is the medium used to provide simplex, half duplex and/or full duplex communications links between various devices and computers connected together within data processing environment 200. Network 210 may include connections such as wire, wireless communication links, or fiber optic cables.

Server 220, client 240 and laptop 250 are coupled to network 210 along with storage unit 230. In addition, facility 260 (such as semiconductor fabrication facility) and processing equipment 280 (such a photolithography and etch tools) are coupled to network 210 including wirelessly such as through a network router 273. Data processing systems, such as server 220, storage 230, client 240, laptop 250 and processing equipment 280 contain data and have software applications including software tools executing thereon. Other types of data processing systems such as mobile phones, personal digital assistants (PDAs), smartphones, tablets and netbooks may be coupled to network 210.

Server 220 may include software application 224 and data 226 for preventing double patterning odd cycles or other software applications and data in accordance with embodiments described herein. Storage 230 may contain software application 234 and a content source such as data 236 for preventing double patterning odd cycles. Other software and content may be stored on storage 230 for sharing among various computer or other data processing devices. Client 240 may include software application 244 and data 246. Laptop 250 may also include software applications 254 and data 256. Processing equipment 280 may include software applications 284 and data 286. Other types of data processing systems coupled to network 210 may also include software applications. Software applications could include a web browser, email, or other software application for preventing double patterning odd cycles.

Server 220, storage unit 230, client 240, laptop 250, facility 260, and processing equipment 280 and other data processing devices may couple to network 210 using wired connections, wireless communication protocols, or other suitable data connectivity. Client 240 may be, for example, a personal computer or a network computer.

In the depicted example, server 220 may provide data, such as boot files, operating system images, and applications to client 240 and laptop 250. Server 220 may be a single computer system or a set of multiple computer systems working together to provide services in a client server environment. Client 240 and laptop 250 may be clients to server 220 in this example. Client 240, laptop 250, facility 260 and processing equipment 280 or some combination thereof, may include their own data, boot files, operating system images, and applications. Data processing environment 200 may include additional servers, clients, and other devices that are not shown.

In the depicted example, data processing environment 200 may be the Internet. Network 210 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 200 also may be implemented as a number of different types of networks, such as for example, an intranet, a local area network (LAN), or a wide area network (WAN). FIG. 2 is intended as an example, and not as an architectural limitation for the different illustrative embodiments.

Among other uses, data processing environment 200 may be used for implementing a client server environment in which the embodiments may be implemented. A client server environment enables software applications and data to be distributed across a network such that an application functions by using the interactivity between a client data processing system and a server data processing system. Data processing environment 200 may also employ a service oriented architecture where interoperable software components distributed across a network may be packaged together as coherent business applications.

Figure 3:
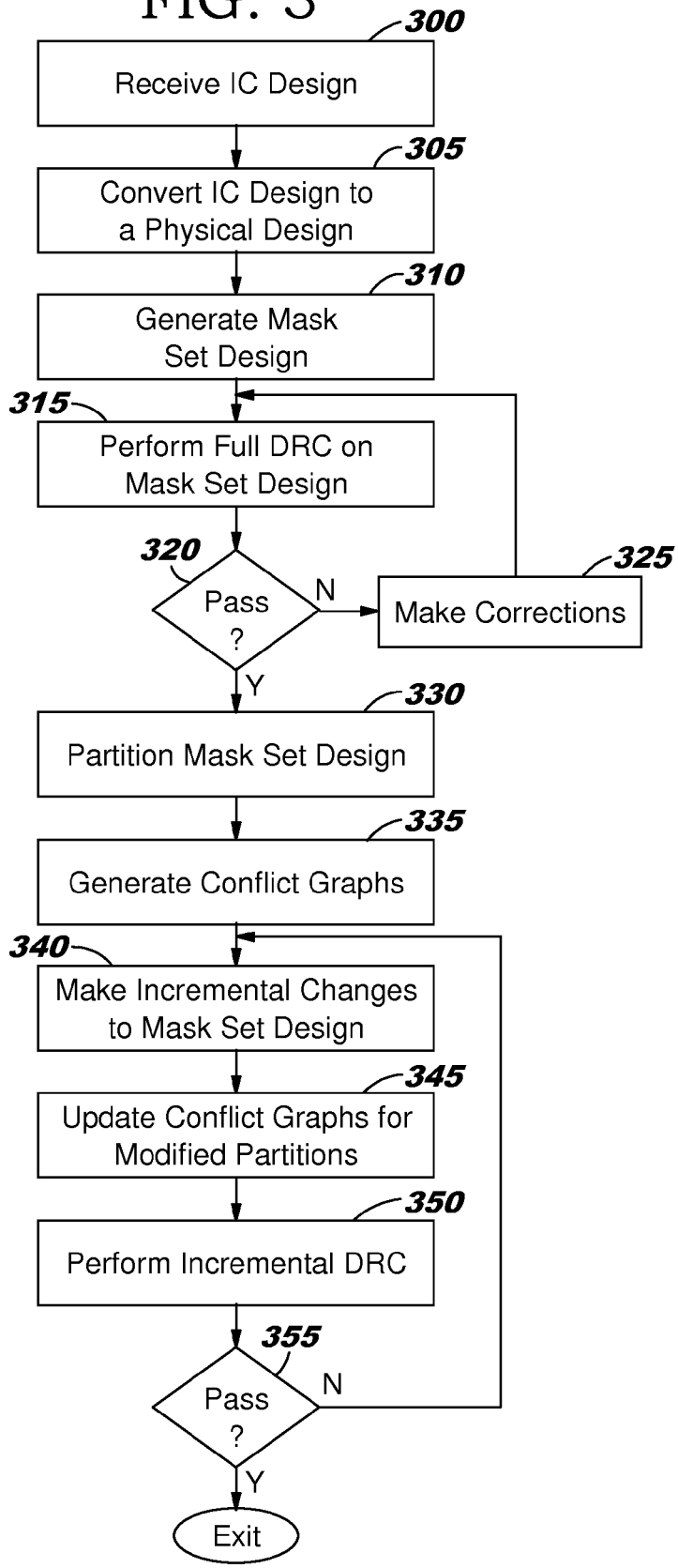
FIG. 3 is a flow diagram of a process for generating and testing a photolithography mask set design in which various embodiments may be implemented.

FIG. 3 is a flow diagram of a process for generating and testing a photolithography mask set design in which various embodiments may be implemented. In a first step 300, an integrated circuit design in the form of a design netlist is received for generating a mask set. In step 305, the design netlist is then converted into a physical design through a variety of steps that may vary depending on the software tools available. The physical design is divided into a series of layers to be manufactured in sequence, some of which are double patterning layers requiring two masks. During step 305, the physical design may be partitioned into multiple partitions for ease of processing.

From this physical design, a preliminary mask set design is generated in step 310 which is suitable for manufacturing the underlying integrated circuit. One or more masks (two in the case of double patterning) may be utilized for each layer of the physical design. The mask set design is generated in accordance with a set of design rules which are a set of parameters provided by manufacturers to enable the designer to verify the correctness of the mask set. Subsequently in step 315, the preliminary mask set design is then subjected to a design rule check (DRC) to verify that the mask set design fully complies with the design rules. This includes determining whether there are any double patterning odd cycles in any layer or double patterning mask set. If there are any odd cycles, then the resulting integrated circuit manufactured utilizing the mask set may not be manufacturable, may not function properly, or yields may be low. In step 320 it is determined whether the mask set design passes the design rule check. If yes, then processing continues to step 330. If not, then processing continues to step 325. In step 325 the designer will make modifications to the mask set design to meet the design rules in a process commonly referred to as rip-up reroute. Processing then returns to step 315 for a further design rule check.

Subsequently in step 330, the partitions created in step 305 above may be modified, additional partitions added, or different partitions may be created for each layer for odd cycle checking. These partitions may help in reducing the amount of processing needed to check incremental modifications to a portion of a partition. Then in step 335 a conflict graph is generated for each partition of each layer of the mask set design. A conflict graph can be utilized to determine whether any odd cycles are introduced by incremental changes to the underlying design. A description of generating conflict graphs is provided below.

After the mask set design passes the design rule check (DRC) in step 320 followed by steps 330 and 335, then in step 340 the designer may make additional incremental layout modifications to the partitioned mask set design for a given layer or layers to enhance the robustness of the design. These incremental layout design modifications can include but are not limited to rip-up reroute, patch up, redundant via insertion and wire spreading. After the design modifications, in step 345 the conflict graphs are updated for the partitions modified above in step 340. The conflict graph updates are based on the incremental changes made to the underlying mask set design. To ensure that these modifications do not generate new design rule violations, in step 350 an incremental DRC is performed including checking the updated conflict graphs on the partitions modified by the designer. In step 355, it is determined whether the new mask set design passes the incremental DRC. If yes, then processing exits. Otherwise, processing returns to step 340 where the designer makes additional modifications to bring the mask set design in compliance with the design rules.

Alternative embodiments may utilize alternative processes and tools to accomplish many of the above steps. Greater detail regarding generating conflict graphs and the utilization of those conflict graphs to prevent odd cycles is provided below.

Although the above and below description is directed at preventing odd cycle issues within mask designs, it could also apply to layout designs including circuit designs and wiring designs. That is, the same design rule checks and odd cycle checks including partitioning, identifying inner cycles and enclosing cycles, etc. could all be utilizing with layout designs. All these types of mask and layout designs are generically referred to as layouts.

Figure 4:
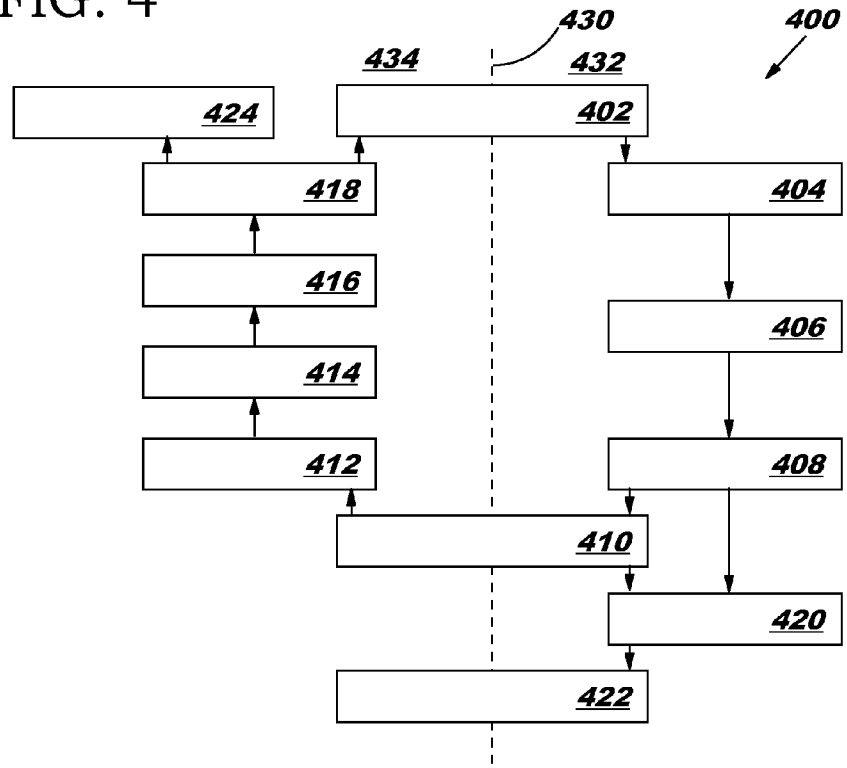
FIG. 4 is a is a diagram of a first type of conflict graph for a single cycle across two partitions in which various embodiments may be implemented.

FIG. 4 is a diagram of a first type of conflict graph for a single cycle across two partitions in which various embodiments may be implemented. A double patterning cycle (generally referred to herein as a cycle) is a sequence of structures arranged in a loop where each structure is close enough to the adjoining structure that no two adjoining structures are manufactured with a single mask (i.e. adjoining structures are manufactured utilizing double patterning). In this diagram, there are 12 structures 402, 404, 406, 408, 410, 412, 414, 416, 418, 420, 422 and 424 that are closely adjoining each other in the manner shown with arrows. That is, structure 402 is closely adjoining structures 404 and 418. As a result, 402 cannot be formed using the same mask or mask sequence as structures 404 and 418 due to their proximity. Although some structures are not in a cycle, structures 402 through 418 are in a cycle. These structures may be mask structures for forming gates, wires, or other semiconductor elements.

In this example, there are a total of 9 structures in this cycle (perhaps as a result of adding structure 414), making it an odd cycle and therefore failing an odd cycle requirement of a design rule check. As a result, either another structure needs to be added to the cycle or one of the structures in the cycle needs to be removed (e.g. remove newly added structure 414). The structure added or removed may be at any point within the cycle. Because structures 420 to 422 and 424 are dead ends (i.e. degenerative) and do not form a cycle, they can be disregarded for these purposes.

Also shown is a dotted line 430 between partitions 432 and 434. In this example, this cycle runs across multiple partitions as indicated by dotted line 430. That is, structures 404, 406 and 408 of the cycle are in partition 432 and structures 412, 414, 416 and 418 of the cycle are in partition 434. Structures 402 and 410 of the cycle are across the structure boundary. This becomes important as will be described below as each conflict graph is generally constructed for a single partition. However, for the initial design rule check of step 325 above, all such cross-partition cycles need to be checked to make sure there are no odd cycles across partition boundaries.

Figure 5:
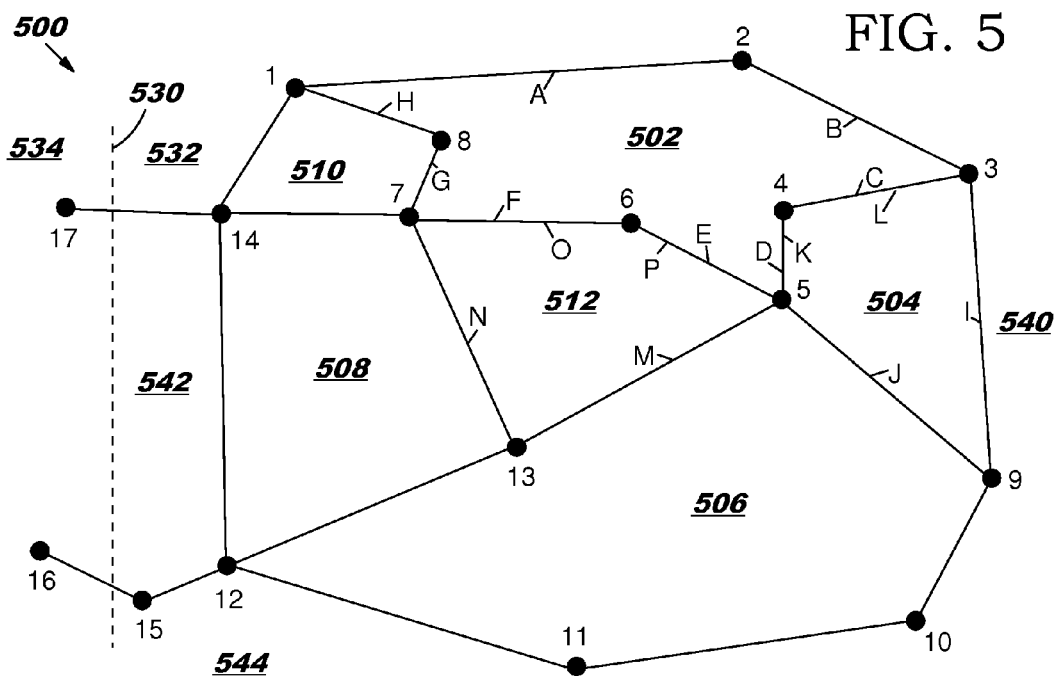
FIG. 5 is a diagram of a second type of conflict graph for multiple cycles across two partitions in which various embodiments may be implemented.

FIG. 5 is a diagram of a second type of conflict graph 500 for multiple cycles across two partitions in which various embodiments may be implemented. In this diagram, there are six readily apparent interconnected cycles 502, 504, 506, 508, 510 and 512 within partition 532. Each cycle is represented with a polygon, each vertex of the polygon represents a structure such as a gate or circuit wire, and each edge representing a close proximity between two edges that requires double patterning. For example, cycle 502 has eight vertices labeled 1 through 8 representing eight structures of a cycle as shown in the diagram. These eight vertices/structures are arranged in a close proximity sequence with edges A, B, C, D, E, F, G, H and back to A. As shown, several of the cycles share a common structure such as the edges between vertices 5 and 6 of cycles 502 and 512 as well as the edges between vertices 3 and 4 of cycles 502 and 504. Each edge may have two faces such as faces E and F of structure 502 that are opposite faces P and O of structure 512. If any of these cycles is an odd cycle (has an odd number of vertices or edges), then a structure (vertex in this diagram) would need to be added or removed. However, if that added or removed structure is shared with another cycle, then additional adjustments would need to be made. A cycle containing two cycles such as 508 and 512 could also be considered a cycle. That is, a cycle bounded by vertices 12, 14, 7, 6, 5, 13 and back to 12 could be considered a compound cycle. However, if all the cycles within a compound cycle are even cycles, then any such compound cycle would also be an even cycle. However, the reverse may not be true. Two odd cycle three sided triangles sharing a single edge and two vertices will create an even compound cycle four sided polygon with four vertices. As a result, it is preferred to look at all single cycles when looking for odd cycles.

A partition boundary 530 is also shown with two partitions 532 and 534. Although the conflict graph was described with reference to partition 532 only, there is an enclosing cycle 540 across the partition boundary with vertices 14, 17, 14, 12, 15, 16, 15, 12, 11, 10, 9, 3, 2, 1 and back to 14. Because cycle 540 has edges facing outward with at least one edge face not facing any other edges of the cycle, then that cycle is referred to herein as an enclosing cycle. Alternatively, when tracing the cycle with the edge face to the left, if the angle between the incoming edge face and outgoing edge face of the leftmost node/vertex is greater than or equal to 180 degrees (i.e. the outer faces of each edge), then the cycle is an enclosing cycle. If the cycle has more than one node/vertex which is equivalently leftmost, the vertex with the smallest Y coordinate may be utilized to determine whether the cycle is an inner or enclosing cycle. Such an enclosing cycle may include one or more cross-partition edges. In addition, a cycle which has all edges facing other edges of that cycle will be referred to herein as an inner cycle. Alternatively, when tracing the cycle with the edge face to the left, if the angle between the incoming edge face and outgoing edge face of the leftmost node/vertex is less than 180 degrees, then the cycle is an inner cycle (i.e. the inner faces of each edge). Enclosing cycle 540 has fifteen vertices (structures) which is an odd number. However, presumably there are also an odd number of structures/vertices in partition 534 that are not shown or the cycle would have failed a design rule check (DRC). That is, if the underlying design passed a design rule check earlier, presumably there are an additional odd number of structures for that cycle in partition 534 to form an even number of structures for cycle 540.

Enclosing cycle 540 could be split into two arcs 542 and 544, each with shared endpoints (16 and 17) in the adjoining partition(s). Arc 542 has vertices 17, 14, 12, 15 and 16 while arc 544 has vertices 16, 15, 12, 11, 10, 9, 3, 2, 1, 14 and 17. Each arc has legs and bodies. The body of an arc includes those edges shared with inner cycles whereas legs include those edges not shared with inner cycles and are located between the body and the cross-partition vertex. For example, 14, 12 is the body while 17, 14 and 16, 15 12 are the legs of arc 542. Identifying such arcs and their component legs and bodies from an enclosing cycle may be useful as described below.

Additional structures may be added to partition 532 as described in step 340 above. As a result, some of these cycles may be affected or additional cycles may be created. Processes for handling these types of modifications will be handled as described below. In addition, an overlap between partitions may be utilized, which allows greater investigation of cross-partition structures/edges for identifying which lead to inner cycles and enclosing cycles.

Figure 6A:
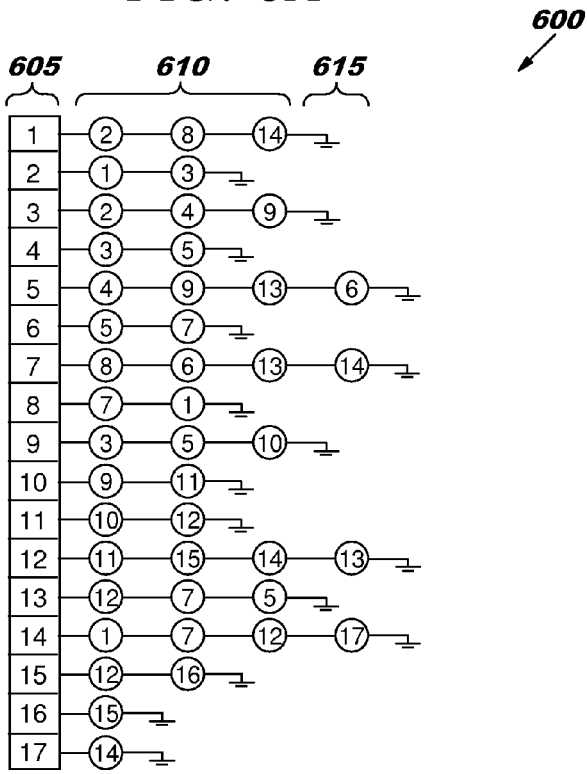
FIGS. 6A and 6B are diagrams of alternative data structures which may be utilized to represent the conflict graph of FIG. 5 in which various embodiments may be implemented.
Figure 6B:
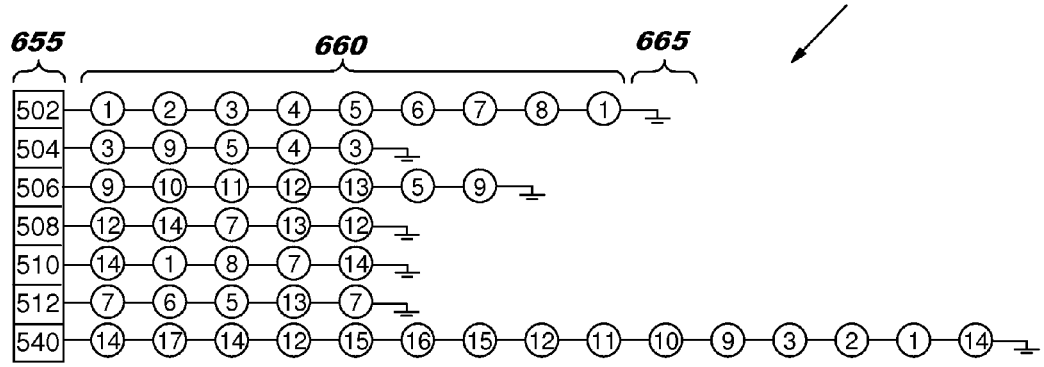

FIGS. 6A and 6B are diagrams of alternative data structures which may be utilized to represent the conflict graph of FIG. 5 in which various embodiments may be implemented. FIG. 6A is directed to a vertex centric data structure 600 whereas FIG. 6B is directed to a cycle centric data structure 650. Either type of data structure may be utilized or both may be utilized together. In alternative embodiments, many different types of data structures may be utilized.

In FIG. 6A, there is a complete listing of all vertices 605. The order of this listing may not be important in this data structure, just that all vertices are included. With each vertex listed is a listing of all other vertices 610 connected to that vertex. For example, vertex 5 is connected to vertices 4, 9, 13 and 6. Each such horizontal listed of connected vertices end with a termination 615 indicting that there are no more vertices connected to that vertex. Although this data structure shows each linkage between vertices twice, each edge is viewed as having two faces and then each face is utilized.

In FIG. 6B, there is a complete listing of all cycles 655. The vertices of each cycle 660 are then listed in sequence in a clockwise fashion. That is, starting at any vertex of that cycle, the edges are followed with the face of the edge to the tracer's left and then the tracer follows the edge faces along the vertices without crossing an edge. As a result, the tracer will generally turn to the right at most vertices in a clockwise direction if an inner cycle is being traced. The starting vertex is also listed as the final vertex to show a complete circuit 665. For example, cycle 508 is shown as vertices 12, 14, 7, 13 and back to 12. With that circuit there are four edges between four vertices which is clearly not an odd cycle. Enclosing Cycle 540 is also shown.

Figure 7A:
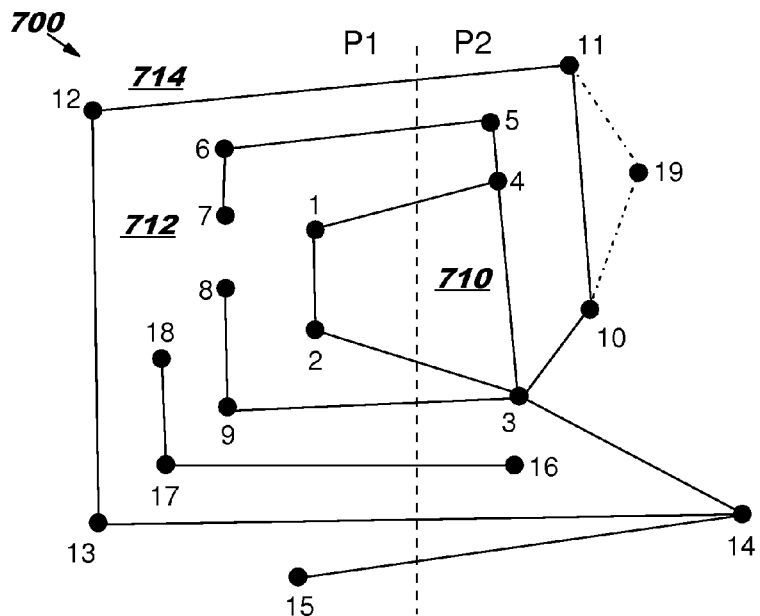
FIGS. 7A, 7B and 7C are diagrams of a conflict graph for multiple cycles across two partitions in which various embodiments may be implemented.
Figure 7B:
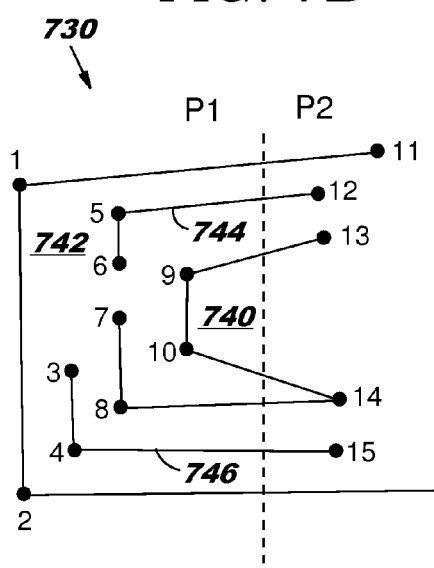
Figure 7C:
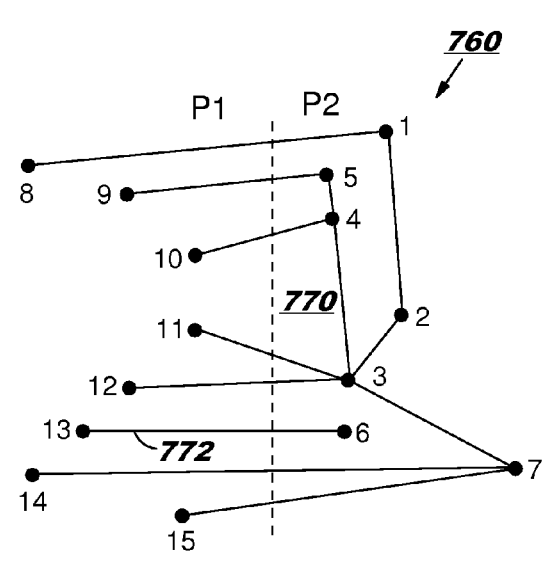

FIGS. 7A, 7B and 7C are diagrams of a conflict graph for multiple cycles across two partitions P1 and P2 in which various embodiments may be implemented. FIG. 7A is an overall conflict graph 700 which could be generated if there was no partitioning or is there was full visibility across partition boundaries. There are a set of 18 vertices (or structures represented by vertices) interconnected (the structures are in close proximity requiring double patterning) as shown. In this example, there are two inner cycles 710 and 712. Cycle 710 is represented by a vertex listing 4, 3, 2, 1, and back to 4. Cycle 712 is represented by a vertex listing 3, 14, 13, 12, 11, 10, 3, 4, 5, 6, 7, 6, 5, 4, 1, 2, 3, 9, 8, 9, and back to 3. Enclosing cycle 714 is represented by vertex listing 3, 10, 11, 12, 13, 14, 15, 14 and 3. As a result, any addition or removal of vertices to any of the cycles should not create and odd cycle. For example, if a vertex 19 was inserted between vertices 10 and 11 as shown with a dashed and dotted lines, then cycles 712 and 714 would be odd cycles and correction would need to be made.

FIG. 7B is a conflict graph 730 generated for partition P1 from the same underlying mask set design as shown in FIG. 7A above. In this example, any edge connecting a partition P1 vertex to a partition P2 vertex (i.e. a partition P1 structure in close proximity to a P2 structure necessitating double patterning) is identified and then tracked to the connecting vertex in partition P2. This allows for preventing odd cycles across multiple partitions as will be described further below. One technique for generating the conflict graph is a form of tracing as described below in FIG. 8. In general, it involves tracing both faces of each edge between each vertex until the completed cycle data structure is generated for that partition. There are 10 vertices identified in partition P1, from which another 6 vertices are identified through a tracing of edges across partition boundaries. As a result, there are no inner cycles and two concentric enclosing cycles 740 and 742 identified for protection from changes that could create odd cycles. Enclosing cycle 740 is defined by vertices 9, 13, 9, 10, 14, 8, 7, 8, 14, 10 and back to 9. Enclosing cycle 742 is defined by vertices 1, 11, 1, 2, 16, 2 and back to 1. Possible cycles 744 and 746 are defined by vertices 6, 5, 12, 5, 6 and vertices 4, 3, 4, 15, 4 respectively. These possible cycles are degenerative and cannot form a cycle as they each do not form a cycle within partition P1 and only have a single cross-partition edge.

FIG. 7C is a conflict graph 760 generated for partition P2 from the same underlying mask set design as shown in FIG. 7A above. In this example, any edge connecting a partition P2 vertex to a partition P1 vertex (i.e. a partition P2 structure in close proximity to a P1 structure necessitating double patterning) is identified and then tracked to the connecting vertex in partition P1. This allows for preventing odd cycles across multiple partitions as will be described further below. One technique for generating the conflict graph showing all cycles for the partition is a form of tracing as described below in FIG. 8. In general, it involves tracing all the faces of the edges between each vertex until the completed conflict graph is generated. There are 7 vertices identified in partition P2, from which another 8 vertices are identified through a tracing of edges across partition boundaries. As a result, there is only one enclosing cycle 770 identified for protection from changes that could create odd cycles and one degenerative non-cycle 772. Further investigation could reduce the number of cross partition edges needing protection from change, but that would require further investigation into the adjoining partition. For example, by tracing just one further vertex into partition 1 could determine that the edge between vertices 7 and 15 is degenerative and could be modified without affecting a cycle so long as that modification remains degenerative and does not create another cycle. A decision on the amount of time spent to remove degenerative cross-partition edges versus the benefit could be utilized to determine the optimum amount of cross-partition tracing.

Figure 8A:
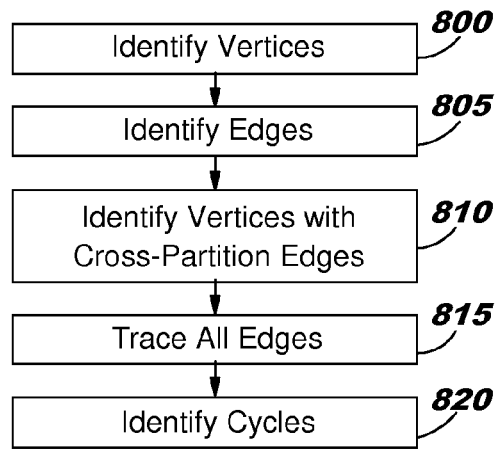
FIGS. 8A, 8B and 8C are flow diagrams for creating and incrementally modifying conflict graphs for each partition of each double patterning layer in which various embodiments may be implemented.
Figure 8B:
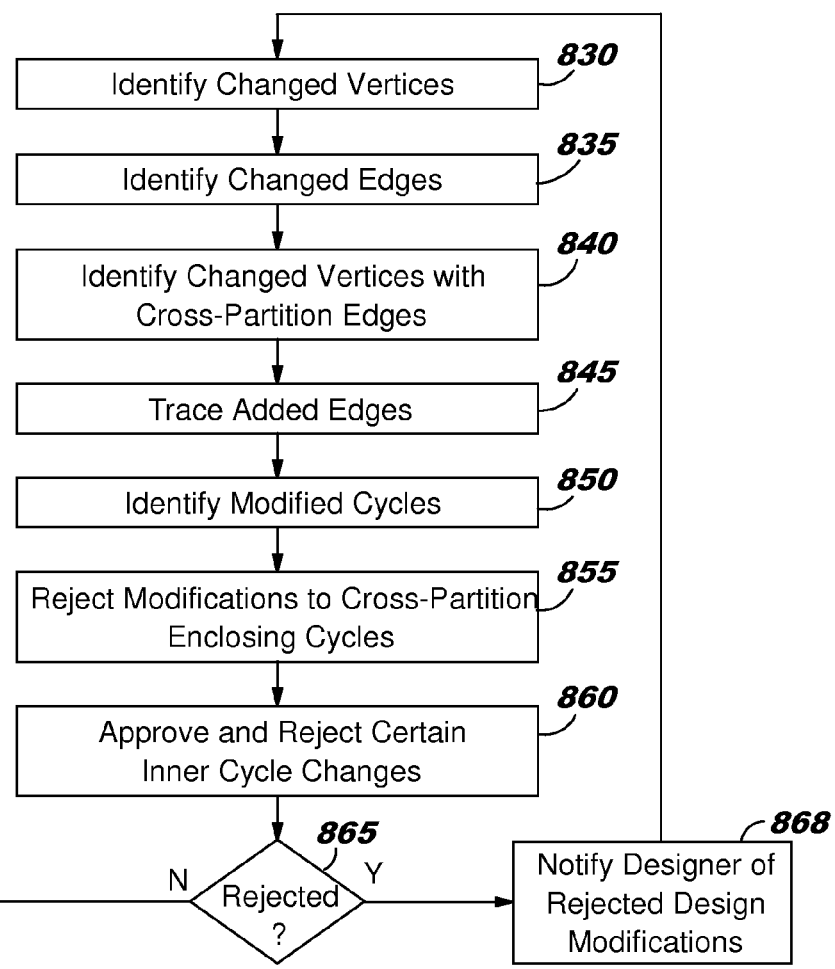
Figure 8C:
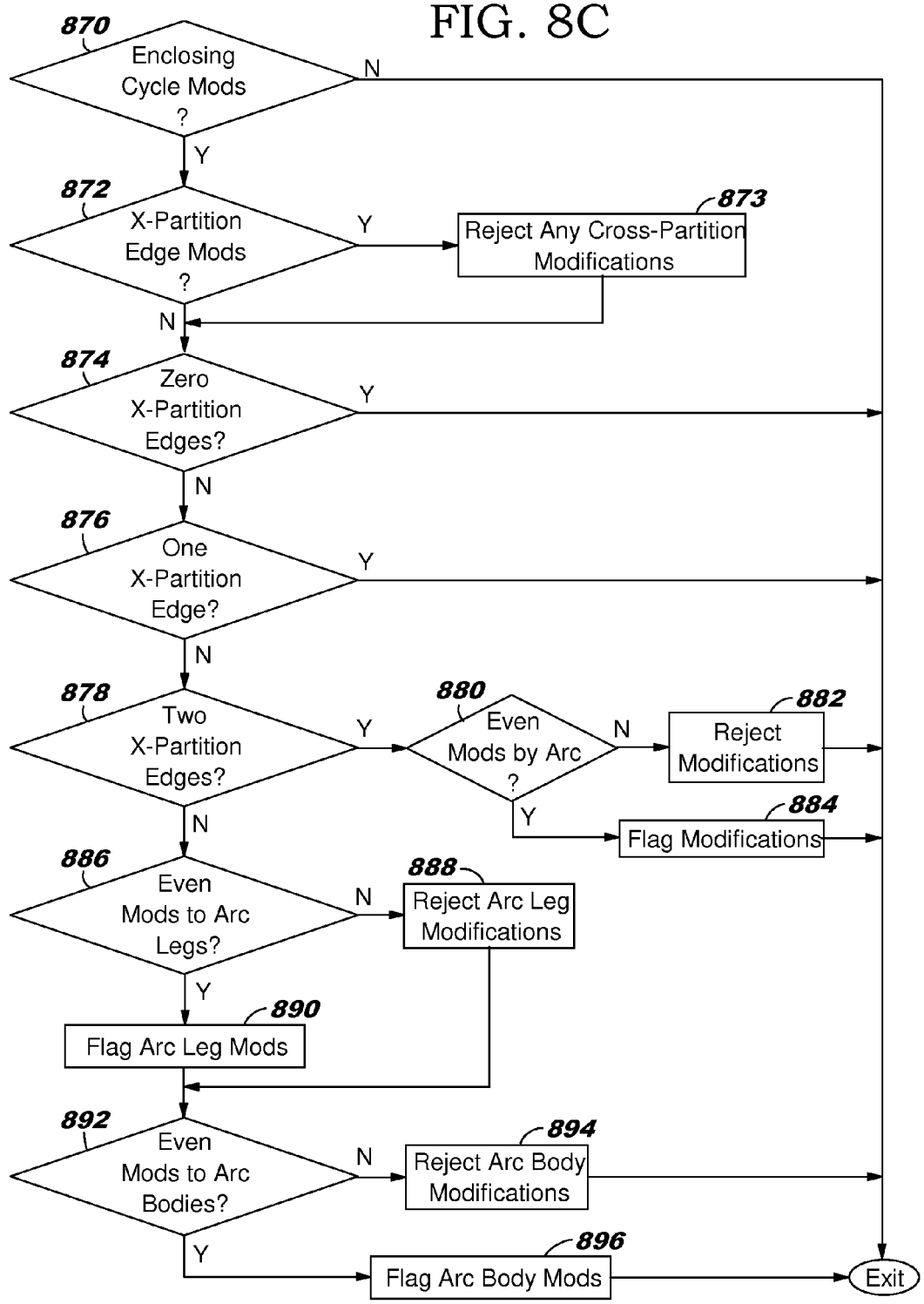

FIGS. 8A, 8B and 8C are flow diagrams for creating and incrementally modifying conflict graphs for each partition of each double patterning layer in which various embodiments may be implemented. That is, the processes described in FIGS. 8A, 8B and/or 8C can be repeated for each partition for each double patterning layer in the mask set design. In the first embodiment, any changes to a cross-partition enclosing cycle are conservatively and efficiently rejected as described in FIG. 8B. Alternatively, in the second embodiment, certain changes to a cross-partition enclosing cycle may be allowed as described in FIG. 8C.

FIG. 8A is a flow diagram of creating a conflict graph for a partition in which various embodiments may be implemented. This process is executed after a design rule check has been performed. In a first step 800, all vertices (structures) that are possible candidates for double patterning are identified. Then in step 805 all edges (indicating close proximity necessitating double patterning) between such vertices are identified. Subsequently in step 810, all vertices with connecting edges to vertices in adjoining partitions are identified. This can be accomplished by having an overlap region with the adjoining partitions sufficiently wide to identify any vertices (structures) in close proximity with any vertices in the immediate partition. This would create a set of vertices and edges such as shown in FIGS. 5 and 7 above.

Subsequently in step 815 tracing starts from one of the vertices. During tracing, each side (face) of each edge is traced resulting in tracing each edge face twice. Using a left hand approach (travelling along the face of edges with the edges to the left), all the above edges are traced to identify all cycles in the conflict graph. For example, the conflict graph of FIG. 7C would be traced as 1→8→1→2→3→4→5→9→5→4→10→4→3→11→3→12→3→7→14→7→15→7→3→2→1 and separately 6→13→6, thereby tracing both faces of all edges and vertices of FIG. 7C. Alternatively, a right hand approach could be utilized. Then in step 820, the various cycles for the partition are identified from the tracing. If a trace creates a complete circuit (starts and ends at the same vertex) without crossing any edges, then a potential cycle has been identified. If the edges of the cycle all face other edges, then the cycle is an inner cycle. If any of the edges of the cycle do not face any other edge of that cycle, then the cycle is an enclosing cycle. If the cycle does not form a loop where each face of every edge is traced, and if there is one or fewer cross-partition edges, then a degenerative non-cycle has been traced. Once the tracing is completed and all edges and vertices have been traced, the tracing process ceases. Since the tracing is performed after a design rule check, all cycles are assumed to be even cycles, even if enclosing cycles on the edge of a partition have an odd number of edges.

FIG. 8B is a flow diagram of modifying a conflict graph for an incrementally modified partition in accordance with a first embodiment. In this process, only those modified vertices and edges and certain resulting cycles are incrementally reviewed for odd cycles. In a first step 830, all vertices (structures) that have been added or removed and which are possible candidates for double patterning are identified. Then in step 835 all new or removed edges (indicating close proximity necessitating double patterning) between such vertices are identified. Subsequently in step 840, all new or removed vertices with connecting edges to vertices in adjoining partitions are identified. This can be accomplished by having an overlap region with the adjoining partitions sufficiently wide to identify any vertices (structures) in close proximity with any new or removed vertices in the immediate partition. This would create a set of vertices and edges for incremental analysis.

Subsequently in step 845 tracing starts from one of the added vertices. Using a left hand approach (travelling along the face of edges with the edges to the left as described above in FIG. 5), all the above added edges are traced to identify all new cycles in the conflict graph. Then in step 850, the various new cycles for the partition are identified from the tracing, the modified cycles are identified from the added and removed vertices, and the removed cycles are identified from the removed vertices and previous tracing. If a trace creates a complete circuit (starts and ends at the same vertex) without crossing any edges, then a cycle may have been identified unless it is a degenerative non-cycle. If the edges of the cycle all face other edges, then the cycle is an inner cycle. Alternatively, when tracing the cycle, if the angle between the edges of the leftmost node is less than 180 degrees, then the cycle is an inner cycle. If any of the edges of the cycle do not face any other edge of that cycle, then the cycle is an enclosing cycle. Alternatively, when tracing the cycle, if the angle between the edges of the leftmost node is greater than 180 degrees, then the cycle is an enclosing cycle. If the cycle has more than one node/vertex which is equivalently leftmost, the vertex with the smallest Y coordinate may be utilized to determine whether the cycle is an inner or enclosing cycle. Such an enclosing cycle may include one or more cross-partition edges. Once the tracing is completed and all edges and vertices have been traced, the tracing process ceases.

In step 855, all mask set design changes that modify an enclosing cycle with one or more cross-partition edge are automatically rejected. That is, all mask set design changes which modify enclosing loop cycles across partition boundaries (i.e. has a cross-partition edge) are automatically rejected as a full count of vertices and edges for that cycle cannot be verified due to the cross-partition nature of the cycle. In step 860, all remaining modifications (not including modifications rejected in step 855) to inner cycles are reviewed. This includes approving any remaining mask set design changes which remove inner cycles. In addition, all remaining modified and newly created inner cycles are reviewed for odd cycles. If an odd cycle has been created, then the mask set design change(s) creating that odd cycle are rejected. Finally, in step 865, if any mask set design modifications are rejected in steps 855 or 860, then the designer is notified of the rejected modifications in step 868 and processing returns to step 830 above after the designer has made more modifications correcting the those rejected modifications, otherwise processing exits.

FIG. 8C is a flow diagram of step 855 of FIG. 8B in accordance with a second embodiment. Certain modifications to enclosing cycles with cross-partition edges may not be rejected in this embodiment. In a first step 870, it is determined whether there are any modifications to the enclosing cycle. If not, then processing exits and returns to step 860 of FIG. 8B, otherwise processing continues to step 872.

In step 872, it is determined whether any cross-partition edges were added or removed. If yes, then unknown changes may have occurred in the adjoining partition, resulting in the addition, removal or modification of adjoining partition cycles. As a result, processing continues to step 873 where any cross-partition modification is rejected unless that cross-partition modification clearly affects only a degenerative edge in the current partition. That is, if a cross-partition edge only connects to a degenerative line of the current partition such as 746 of FIG. 7B or 772 of FIG. 760, then no cross-partition cycles have been affected. Processing then continues to step 874 after step 873 or if no in step 872.

In step 874, it is determined whether the enclosing cycle (not including the rejected changes of step 872) has no cross-partition edges. If yes, then no modifications are approved or rejected and processing exits to return to step 860 of FIG. 8B. Otherwise, processing continues to step 876.

In step 876, it is determined whether the enclosing cycle has a single cross-partition edge. If yes, then that cross-partition edge is degenerative as there is not a second cross-partition edge to create a cross-partition cycle. If yes in step 876, then no modifications are approved or rejected and processing exits to return to step 860 of FIG. 8B, otherwise processing continues to step 878.

In step 878, it is determined whether the enclosing cycle has only two cross-partition edges. If yes, then processing continues to step 880, otherwise processing continues to step 884. In step 880, it is determined whether the modifications to the enclosing cycle adds or removes an even number of edges to each arc of the enclosing cycle. That is, with two cross-partition edges two arcs are created, each with shared endpoints in the adjoining partition as described with reference to FIG. 5 above. Each arc may have an even number of edges added or removed (zero is an even number). Even if there is a cross-partition cycle between the two cross-partition edges, that cross-partition cycle would allow an even number of edges allowed or removed for the portion of that cycle within the current partition. If no in step 880, then the modifications are rejected in step 882 and processing exits to return to step 860 of FIG. 8B. Otherwise, in step 884 any such modifications are flagged for reprocessing later and processing exits, without any modifications rejected or accepted, to step 860 of FIG. 8B. If any of the flagged modifications are later rejected in step 860, then the arcs would need to be checked again in step 880.

If no in step 878, then the enclosing cycle has three or more cross-partition edges and processing continues to step 886. In step 886, it is determined whether there is an even number of modifications to the body of each arc. If not, then those modifications are rejected in step 888 and processing continues to step 892. Otherwise, any arc body modifications are flagged in step 890 for reprocessing later and processing continues to step 892. In step 892, it is determined whether there is an even number of modifications to each leg of each arc. If not, then those modifications are rejected in step 894 and processing exits. Otherwise, any arc leg modifications are flagged in step 896 for reprocessing later and processing then exits. If any of the flagged modifications are later rejected in step 860, then the arcs would need to be checked again in step 886 and 892.

The above processes for FIGS. 8A, 8B and/or 8C are repeated for each modified partition of each double patterning layer of the mask design set. Separate conflict graphs are maintained for each such partition. Although the above was described with reference to a single set of inner cycles contained within an enclosing cycle, a partition may contain multiple sets of enclosing cycles, each enclosing cycle possibly containing one or more inner cycles.

Although the above is directed at preventing odd cycle issues within mask designs, it could also apply to layout designs including circuit designs and wiring designs. That is, the same design rule checks and odd cycle checks including partitioning, identifying inner cycles and enclosing cycles, etc. could all be utilizing with mask design and layout designs. All these types of mask and layout designs are generically referred to as layouts. In addition, the above may be applied to 3D (three dimensional) printing. For example, multiple layers may be deposited or otherwise printed to create a 3D structure with adjoining layers having different layouts to create fine detail structures. In such a case, double patterning layouts may be utilized creating the need for preventing odd cycles.

The invention can take the form of an entirely software embodiment, or an embodiment containing both hardware and software elements. In a preferred embodiment, the embodiments are implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM), or Flash memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code such as for preventing double patterning odd cycles. A client data processing system may download that computer usable code, such as for storing on a data storage medium associated with the client data processing system, or for using in the client data processing system. The server data processing system may similarly upload computer usable code from the client data processing system such as a content source. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of preventing odd cycles caused by design modifications to a double patterning layout including a plurality of partitions comprising:

utilizing a processor to identify a set of potential double patterning cycles in a partition of the layout, the set of potential double patterning cycles including a cross-partition subset of double patterning cycles that include cross-partition edges that extend from vertices in the partition to closely proximate vertices in adjoining partitions, for storage in a memory;

receiving a set of design modifications to the partition;

utilizing the processor to identify from the set of potential double patterning cycles a subset of double patterning cycles affected by the set of design modifications to the partition;

utilizing the processor to identify from the set of design modifications a subset of design modifications to the partition which may cause odd cycles in the subset of double patterning cycles; and providing a notification of the subset of design modifications to the partition.

2. The method of claim 1 wherein the subset of double patterning cycles includes a subset of inner cycles and a subset of enclosing cycles.

3. The method of claim 2 wherein utilizing the processor to identify the subset of design modifications includes identifying design modifications which cause odd cycles in the subset of inner cycles.

4. The method of claim 3 wherein utilizing the processor to identify the subset of design modifications includes identifying design modifications which cause modifications to the subset of enclosing cycles.

5. The method of claim 3 wherein utilizing the processor to identify the subset of design modifications includes identifying design modifications which cause modifications to arcs of the subset of enclosing cycles.

6. The method of claim 3 wherein utilizing the processor to identify the subset of design modifications includes identifying design modifications which cause modifications to arc legs and arc bodies of the subset of enclosing cycles.

7. The method of claim 1 wherein the notification includes a rejection of the subset of modifications.

8. The method of claim 1 wherein utilizing the processor to identify a set of double patterning cycles in the layout includes generating a conflict graph.

9. The method of claim 1 further comprising rejecting any of the set of design modifications which modify any cross-partition edges of the cross-partition subset of double patterning cycles.

10. The method of claim 9 further comprising determining whether the set of design modifications modify an odd number of edges to each arc of any of the cross-partition subset of double patterning cycles with two cross-partition edges, and upon a positive determination rejecting the design modifications that modify the odd number of edges.

11. A computer usable program product comprising a non-transitory computer usable storage medium including computer usable code for use in preventing odd cycles caused by design modifications to a double patterning layout, the computer usable program product comprising code for performing the steps of:

utilizing a processor to identify a set of potential double patterning cycles in a partition of the layout, the set of potential double patterning cycles including a cross-partition subset of double patterning cycles that include cross-partition edges that extend from vertices in the partition to closely proximate vertices in adjoining partitions, for storage in a memory;

receiving a set of design modifications to the partition;

utilizing the processor to identify from the set of potential double patterning cycles a subset of double patterning cycles affected by the set of design modifications to the partition;

utilizing the processor to identify from the set of design modifications a subset of design modifications to the partition which may cause odd cycles in the subset of double patterning cycles; and providing a notification of the subset of design modifications to the partition.

12. The computer usable program product of claim 11 wherein the subset of double patterning cycles includes a subset of inner cycles and a subset of enclosing cycles.

13. The computer usable program product of claim 12 wherein utilizing the processor to identify the subset of design modifications includes identifying design modifications which cause odd cycles in the subset of inner cycles.

14. The computer usable program product of claim 13 wherein utilizing the processor to identify the subset of design modifications includes identifying design modifications which cause modifications to the subset of enclosing cycles.

15. The computer usable program product of claim 13 wherein utilizing the processor to identify the subset of design modifications includes identifying design modifications which cause modifications to arcs of the subset of enclosing cycles.

16. The computer usable program product of claim 13 wherein utilizing the processor to identify the subset of design modifications includes identifying design modifications which cause modifications to arc legs and arc bodies of the subset of enclosing cycles.

17. The computer usable program product of claim 11 wherein the notification includes a rejection of the subset of modifications.

18. The computer usable program product of claim 11 wherein utilizing the processor to identify a set of double patterning cycles in the layout includes generating a conflict graph.

19. The computer usable program product of claim 11 further comprising rejecting any of the set of design modifications which modify any cross-partition edges of the cross-partition subset of double patterning cycles.

20. A data processing system for preventing odd cycles caused by design modifications to a double patterning layout, the data processing system comprising:

a processor; and a memory storing program instructions which when executed by the processor execute the steps of:

utilizing the processor to identify a set of potential double patterning cycles in a partition of the layout, the set of potential double patterning cycles including a cross-partition subset of double patterning cycles that include cross-partition edges that extend from vertices in the partition to closely proximate vertices in adjoining partitions, for storage in the memory;

receiving a set of design modifications to the partition;

utilizing the processor to identify from the set of potential double patterning cycles a subset of double patterning cycles affected by the set of design modifications to the partition;

utilizing the processor to identify from the set of design modifications a subset of design modifications to the partition which may cause odd cycles in the subset of double patterning cycles; and providing a notification of the subset of design modifications to the partition.

21. The data processing system of claim 20 wherein the subset of double patterning cycles includes a subset of inner cycles and a subset of enclosing cycles.

22. The data processing system of claim 21 wherein utilizing the processor to identify the subset of design modifications includes identifying design modifications which cause odd cycles in the subset of inner cycles.

23. The data processing system of claim 22 wherein utilizing the processor to identify the subset of design modifications includes identifying design modifications which cause modifications to the subset of enclosing cycles.

24. The data processing system of claim 22 wherein utilizing the processor to identify the subset of design modifications includes identifying design modifications which cause modifications to arcs of the subset of enclosing cycles.

25. The data processing system of claim 22 wherein utilizing the processor to identify the subset of design modifications includes identifying design modifications which cause modifications to arc legs and arc bodies of the subset of enclosing cycles.

26. The data processing system of claim 20 wherein the notification includes a rejection of the subset of modifications.

27. The data processing system of claim 20 wherein utilizing the processor to identify a set of double patterning cycles in the layout includes generating a conflict graph.

28. The data processing system of claim 20 further comprising rejecting any of the set of design modifications which modify any cross-partition edges of the cross-partition subset of double patterning cycles.

29. A data processing system for preventing odd cycles to a double patterning layout, the data processing system comprising:

means for identifying a set of potential double patterning cycles in a partition of the layout, the set of potential double patterning cycles including a cross-partition subset of double patterning cycles that include cross-partition edges that extend from vertices in the partition to closely proximate vertices in adjoining partitions;

means for receiving a set of design modifications to the partition;

means for identifying from the set of potential double patterning cycles a subset of double patterning cycles affected by the set of design modifications to the partition;

means for identifying from the set of design modifications a subset of design modifications to the partition which may cause odd cycles in the subset of double patterning cycles; and means for providing a notification of the subset of design modifications to the partition.

* * * * *